(12) United States Patent
Sakashita

(10) Patent No.: US 6,885,540 B2
(45) Date of Patent: Apr. 26, 2005

(54) MULTI-LAYERED UNIT INCLUDING ELECTRODE AND DIELECTRIC LAYER

(75) Inventor: Yukio Sakashita, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 10/375,897

(22) Filed: Feb. 26, 2003

(65) Prior Publication Data
US 2004/0165334 A1 Aug. 26, 2004

(51) Int. Cl.$^7$ .............................................. H01G 4/228
(52) U.S. Cl. ............................. 361/306.3; 361/306.1; 361/321.1; 361/321.4; 361/311; 361/328
(58) Field of Search .................... 361/306.1, 306.3, 361/321.1, 321.4, 320, 311, 313, 328, 329, 330; 438/239, 253, 256, 386

(56) References Cited

U.S. PATENT DOCUMENTS

| | | | |
|---|---|---|---|
| 5,206,788 A * | 4/1993 | Larson et al. ............... | 361/313 |
| 5,248,564 A | 9/1993 | Ramesh ...................... | 428/688 |
| 5,426,075 A * | 6/1995 | Perino et al. ................. | 438/3 |
| 5,879,956 A | 3/1999 | Seon et al. ................... | 438/3 |
| 5,994,276 A | 11/1999 | Hughes et al. .............. | 505/238 |
| 6,096,343 A | 8/2000 | Gergely et al. ............. | 424/499 |
| 6,096,434 A | 8/2000 | Yano et al. .................. | 428/446 |
| 6,194,227 B1 * | 2/2001 | Hase ............................... | 438/3 |
| 6,194,753 B1 | 2/2001 | Seon et al. .................. | 257/295 |
| 6,287,969 B1 | 9/2001 | Hughes et al. .............. | 438/687 |
| 6,303,231 B1 * | 10/2001 | Sawada et al. ............. | 428/470 |
| 6,387,712 B1 | 5/2002 | Yano et al. ...................... | 438/3 |
| 2003/0119212 A1 * | 6/2003 | Nishihara et al. ............... | 438/3 |
| 2003/0136998 A1 | 7/2003 | Baniecki et al. ............ | 257/310 |
| 2004/0029399 A1 * | 2/2004 | Honma et al. .............. | 438/778 |

FOREIGN PATENT DOCUMENTS

JP 2001-015382 1/2001

OTHER PUBLICATIONS

T. Takenaka "Study on the particle orientation of bismuth layer structured ferroelectric ceramics and their application to piezoelectric or pyroelectric materials," *Engineering Doctoral These at the University of Kyoto*, Dec. 1984, pp. 1–170.

* cited by examiner

Primary Examiner—Dean A. Reichard
Assistant Examiner—Nguyen T. Ha
(74) Attorney, Agent, or Firm—Seed IP Law Group PLLC

(57) ABSTRACT

A multi-layered unit according to the present invention includes a support substrate formed of a silicon single crystal, a barrier layer formed of silicon oxide on the support substrate, an electrode layer, which is formed of BSCCO (bismuth strontium calcium copper oxide) having a stoichiometric composition represented by $Bi_2Sr_2CaCu_2O_8$, having an anisotropic property and conductivity and enabling epitaxial growth of a dielectric material containing a bismuth layer structured compound thereon and is oriented in the c axis direction, and a dielectric layer formed by epitaxially growing a dielectric material containing a bismuth layer structured compound having a composition represented by $SrBi_4Ti_4O_{15}$ on the electrode layer and oriented in the c axis direction on the electrode layer.

24 Claims, 2 Drawing Sheets

MULTI-LAYERED UNIT INCLUDING ELECTRODE AND DIELECTRIC LAYER

BACKGROUND OF THE INVENTION

The present invention relates to a multi-layered unit including an electrode and a dielectric layer and, particularly, to a multi-layered unit including an electrode and a dielectric layer which constitute a compact thin film capacitor that is suitable for incorporation into a semiconductor wafer together with other devices such as a field effect transistor (FET), a CPU (central processing unit) and the like, and has a large capacity and an excellent dielectric characteristic.

DESCRIPTION OF THE PRIOR ART

There is known a semiconductor device fabricated by incorporating a capacitor into a semiconductor wafer together with other devices such as a field effect transistor (FET) and a CPU (central processing unit).

In such a semiconductor device, since it is preferable for fabricating a semiconductor device of excellent quality to form the capacitor together with the other devices using a semiconductor process, a capacitor of a silicon system material capable of being formed by a semiconductor process is normally formed in the semiconductor device.

However, since a silicon system material suitable for fabricating a capacitor using a semiconductor process has a low dielectric constant, in the case of fabricating a capacitor having large capacity, the area of the capacitor inevitably becomes large and, therefore, the semiconductor device must be large, It might be thought that this problem can be solved by incorporating a thin film capacitor having a small size and large capacity into a semiconductor wafer, thereby fabricating a semiconductor device.

Japanese Patent Application Laid Open No. 2001-15382 discloses a thin film capacitor having a small size and large capacity which uses PZT, PLZT, (Ba, Sr) $TiO_3$ (BST), $Ta_2O_5$ or the like as a dielectric material, However, the dielectric constant of a dielectric thin film formed of any one of the above mentioned materials decreases as the thickness thereof decreases and the capacitance thereof greatly decreases when an electric field of 100 kV/cm, for example, is applied thereto. Therefore, in the case where any one of the above-mentioned materials is used as a dielectric material for a thin film capacitor, it is difficult to obtain a thin film capacitor having a small size and large capacity. Moreover, since the surface roughness of a dielectric thin film formed of any one of the above mentioned materials is high, its insulation performance tends to be lowered when formed thin.

It might be thought possible to overcome these problems by using a bismuth layer structured compound as a dielectric material for a thin film capacitor. The bismuth layer structured compound is discussed by Tadashi Takenaka in "Study on the particle orientation of bismuth layer structured ferroelectric ceramics and their application to piezoelectric or pyroelectric materials," Engineering Doctoral Thesis at the University of Kyoto (1984), Chapter 3, pages 23 to 36.

The bismuth layer structured compound has an anisotropic crystal structure and basically behaves as a ferroelectric material. However, it is known that the bismuth layer structured compound exhibits only weak property as a ferroelectric material and behaves like as a paraelectric material along a certain axis of orientation.

In the case of utilizing the bismuth layer structured compound as a dielectric material for a thin film capacitor, since the property thereof as a ferroelectric material causes variation in the dielectric constant, this property of the bismuth layer structured compound is undesirable and it is preferable for the bismuth layer structured compound to sufficiently exhibit a property as a paraelectric material.

Therefore, a need has been felt for the development of a thin film capacitor that has a large capacity and an excellent dielectric property, including a dielectric layer in which a bismuth layer structured compound is oriented in a direction along which the bismuth layer structured compound exhibits only weak property as a ferroelectric material and behaves like a paraelectric material, and that is suitable for incorporation into a semiconductor wafer together with other devices such as a field effect transistor (FET) and a CPU (central processing unit).

SUMMARY OF THE INVENTION

It is therefore an object of the present invention to provide a multi-layered unit including an electrode and a dielectric layer which constitute a compact thin film capacitor that is suitable for incorporation into a semiconductor wafer together with other devices such as a field effect transistor (FET), a CPU (central processing unit) and the like, and has a large capacity and an excellent dielectric characteristic.

The above and other objects of the present invention can be accomplished by a multi-layered unit constituted by forming on a semiconductor wafer, a barrier layer, an electrode layer, which is formed of a material having an anisotropic property and conductivity and enabling epitaxial growth of a dielectric material containing a bismuth layer structured compound thereon and is oriented in a [001] direction, and a dielectric layer formed by epitaxially growing a dielectric material containing a bismuth layer structured compound on the electrode layer and formed of the dielectric material containing the bismuth layer structured compound oriented in the [001] direction in this order.

In the present invention, the [001] direction as termed herein means the [001] direction of a cubic crystal, a tetragonal crystal, a monoclinic crystal or an orthorhombic crystal.

According to the present invention, since the barrier layer is formed on the semiconductor wafer, it is possible to prevent components of the electrode layer from diffusing into the semiconductor wafer and the semiconductor wafer from being affected by the electrode layer and, therefore, it is possible to form the electrode layer of a material having an anisotropic property and conductivity and enabling growth of a dielectric material containing a bismuth layer structured compound thereon, thereby forming an electrode layer in a desired manner and orienting it in the [001] direction.

Further, according to the present invention, since the electrode layer is formed of a material having an anisotropic property and conductivity and enabling epitaxial growth of a dielectric material containing a bismuth layer structured compound thereon and is oriented in the [001] direction, the electrode layer can serve as a buffer layer and it is therefore possible to reliably form a dielectric layer containing a dielectric material containing a bismuth layer structured compound oriented in the [001] direction by epitaxially growing the dielectric material containing the bismuth layer structured compound on the electrode layer.

Therefore, according to the present invention, since the c axis of the bismuth layer structured compound contained in the dielectric layer can be oriented so as to be perpendicular to the electrode layer, in the case of, for example, providing an upper electrode on the dielectric layer and applying a voltage between the electrode layer and the upper electrode, the direction of the electric field substantially coincides with the c axis of the bismuth layer structured compound contained in the dielectric layer. Accordingly, since the ferroelectric property of the bismuth layer structured compound can be suppressed and the paraelectric property thereof can be fully exhibited, it is possible to fabricate an integrated device with a semiconductor by incorporating a thin film capacitor having a small size and large capacity into a semiconductor wafer together with other devices.

Furthermore, since the dielectric layer of the dielectric material containing the bismuth layer structured compound whose c axis orientation is improved has a high insulating property, it is possible to form the dielectric layer thinner. Therefore, it is possible to make a thin film capacitor much smaller and make an integrated device with a semiconductor into which a thin film capacitor is incorporated much smaller.

Moreover, according to the present invention, in the case of mounting other semiconductor devices such as a CPU (central processing unit) on a thin film capacitor fabricated by forming an upper electrode on the dielectric layer, since other semiconductor devices are normally formed on a semiconductor wafer, the coefficient of thermal expansion of the thin film capacitor coincides with those of the semiconductor devices mounted thereon because the semiconductor wafers of the other semiconductor devices and the semiconductor wafer of the thin film capacitor are made of the same material and, therefore, it is possible to prevent connections between the thin film capacitor and the other devices from being broken due to the difference in coefficient of thermal expansion between the devices mounted on the semiconductor wafers.

In the present invention, the dielectric material containing the bismuth layer structured compound may contain unavoidable impurities.

In the present invention, the material for forming the semiconductor wafer is not particularly limited insofar as it can be used for fabricating a semiconductor device into which various devices are to be incorporated, and a silicon single crystal, gallium arsenide crystal and the like can be used for forming the semiconductor wafer.

In the present invention, the multi-layered unit includes a barrier layer on the semiconductor wafer. The barrier layer serves to prevent components of an electrode layer formed on the barrier layer from diffusing into the semiconductor wafer and the semiconductor wafer from being affected by the electrode layer.

In the present invention, the material for forming the barrier layer is not particularly limited insofar as it can prevent the semiconductor wafer from being affected by the electrode layer. In the case where a silicon single crystal is used as a semiconductor wafer, silicon oxide is preferably selected for forming the barrier layer from the viewpoint of cost, and in the case where a gallium arsenide crystal is used as the semiconductor wafer, aluminum oxide ($Al_2O_3$) or magnesium oxide (MgO) is preferably selected from the viewpoint of stability.

The barrier layer is formed to have a thickness so that an electrode layer to be formed thereon does not affect the semiconductor wafer.

In the present invention, the multi-layered unit includes an electrode layer oriented in the [001] direction, namely, the c axis direction on the barrier layer.

In the present invention, the electrode layer is formed of a material having an anisotropic property and conductivity and enabling epitaxial growth of a dielectric material containing a bismuth layer structured compound and is oriented in the [001] direction. Therefore, the electrode layer serves as an electrode and a buffer layer for ensuring that the dielectric layer containing a bismuth layer structured compound oriented in the [001] direction, namely, the c axis direction, can be formed by epitaxially growing a dielectric material containing the bismuth layer structured compound thereon.

In the case of directly forming an electrode layer made of platinum or the like on the support substrate made of silicon oxide or the like, since the electrode layer tends to be oriented in the [111] direction, it is difficult to epitaxially grow a dielectric layer of a dielectric material containing a bismuth layer structured compound on the electrode layer and orient the bismuth layer structured compound in the [001] direction, namely, the c axis direction. However, in the present invention, since the electrode layer is formed of a material having an anisotropic property and conductivity and enabling epitaxial growth of a dielectric material containing a bismuth layer structured compound, the electrode can be oriented in the [001] direction and it is therefore possible to form a dielectric layer by epitaxially growing a dielectric material containing a bismuth layer structured compound on the electrode layer and reliably orient the bismuth layer structured compound contained in the dielectric layer in the [001] direction, namely, the c axis direction.

In the present invention, the material for forming the electrode layer is not particularly limited insofar as it has an anisotropic property and conductivity and enables epitaxial growth of a dielectric material containing a bismuth layer structured compound thereon, but an oxide superconductor is preferably used for forming the electrode layer.

Among oxide superconductors, a copper oxide superconductor having a $CuO_2$ plane is more preferably used for forming the electrode layer.

Illustrative examples of a copper oxide superconductor having a $CuO_2$ plane usable for forming the electrode layer include BSCCO (bismuth strontium calcium copper oxide) represented by the stoichiometric compositional formula: $Bi_2Sr_2Ca_{n-1}Cu_nO_{2n+4}$ and YBCO (yttrium bismuth copper oxide) represented by the stoichiometric compositional formula: $YBa_2Cu_3O_7$-$\delta$.

In the present invention, it is not absolutely necessary for the degree F of orientation in the [001] direction, namely, c axis orientation of the material having an anisotropic property and conductivity and contained in the buffer layer to be 100% but it is sufficient for the degree F of c axis orientation of the material to be equal to or more than 80%. It is more preferable for the degree of c axis orientation of the material to be equal to or more than 90% and it is much more preferable for the degree of c axis orientation of the material to be equal to or more than 95%.

The degree F of the c axis orientation of the material having an anisotropic property and conductivity is defined by the following formula (1).

$$F=(P-P_0)/(1-P_0)\times 100 \tag{1}$$

In formula (1), $P_0$ is defined as X-ray diffraction intensity of polycrystal whose orientation is completely random in the c axis direction, namely, a ratio of the sum $\Sigma I_0$ (00l) of reflection intensities $I_0$ (00l) from the surface of [001] of polycrystal whose orientation is completely random to the sum $\Sigma I_0$ (hkl) of reflection intensities $I_0$ (hkl) from the respective crystal surfaces of [hkl] thereof ($\Sigma I_0$ (00l)/$\Sigma I_0$ (hkl) and P is defined as X-ray diffraction intensity of the material having an anisotropic property and conductivity in the c axis direction, namely, a ratio of the sum $\Sigma I$ (00l) of reflection intensities I (00l) from the surface of [001] of the material having an anisotropic property and conductivity to the sum $\Sigma I$ (hkl) of reflection intensities I (hkl) from the respective crystal surfaces of [hkl] thereof ($\Sigma I$ (00l)/$\Sigma I$ (hkl)). The symbols h, k and l can assume an arbitrary integer value equal to or larger than 0.

In the above formula (1), since $P_0$ is a known constant, when the sum $\Sigma I$ (00l) of reflection intensities I (00l) from the surface of [001] of the material having an anisotropic property and conductivity and the sum $\Sigma I$ (hkl) of reflection intensities I (hkl) from the respective crystal surfaces of [hkl] are equal to each other, the degree F of the c axis orientation of the material having an anisotropic property and conductivity is equal to 100%.

In the present invention, the electrode layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like.

In the present invention, the multi-layered unit includes a dielectric layer of a dielectric material containing a bismuth layer structured compound oriented in the [001] direction, namely, the c axis direction on the electrode layer.

In the present invention, a dielectric layer is formed by epitaxially growing a dielectric material containing a bismuth layer structured compound on the electrode layer.

Since the dielectric layer is formed by epitaxially growing a dielectric material containing a bismuth layer structured compound on the electrode layer oriented in the [001] direction, it is possible to reliably orient the bismuth layer structured compound contained in the dielectric layer in the [001] direction, namely, the c axis direction. Therefore, in the case where a thin film capacitor is fabricated using the multi-layered unit according to the present invention, since the bismuth layer structured compound does not function as a ferroelectric material but functions as a paraelectric material, it is possible to incorporate a thin film capacitor having a small size and large capacitance into a semiconductor wafer together with other devices.

As a bismuth layer structured compound for forming the dielectric layer, a bismuth layer structured compound having an excellent property as a capacitor material is selected.

The bismuth layer structured compound has a composition represented by the stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W). In the case where the symbol A and/or B includes two or more elements, the ratio of the elements can be arbitrarily determined.

As shown in FIG. 1, the bismuth layer structured compound has a layered structure formed by alternately laminating perovskite layers 1 each including perovskite lattices 1a made of (m−1) $ABO_3$ and $(Bi_2O_2)^{2+}$ layers 2.

The number of laminates each consisting of the perovskite layer 1 and the $(Bi_2O_2)^{2+}$ layer 2 is not particularly limited and it is sufficient for the bismuth layer structured compound to include at least one pair of $(Bi_2O_2)^{2+}$ layers 2 and one perovskite layer 1 sandwiched therebetween.

The c axis of the bismuth layer structured compound means the direction obtained by connecting the pair of $(Bi_2O_2)^{2+}$ layers 2, namely, the [001] direction.

Among the bismuth layer structured compounds represented by the above stoichiometric compositional formula, a bismuth layer structured compound having an excellent property as a capacitor material is used for forming the dielectric layer.

In the present invention, a bismuth layer structured compound for forming the dielectric layer is not particularly limited insofar as it has an excellent property as a capacitor material but a bismuth layer structured compound of the symbol m=4 in the above stoichiometric compositional formula, namely, one that is represented by the stoichiometric compositional formula: $(Bi_2O_2)^{2+}(A_3B_4O_{13})^{2-}$ or $Bi_2A_3B_4O_{15}$ is preferably used because each of them has an excellent property as a capacitor material.

In the present invention, it is not absolutely necessary for the degree F of orientation in the [001] direction, namely, c axis orientation of the bismuth layer structured compound to be 100% and it is sufficient for the degree F of c axis orientation to be equal to or more than 80%. It is more preferable for the degree of c axis orientation of the bismuth layer structured compound to be equal to or more than 90% and it is much more preferable for the degree of c axis orientation of the bismuth layer structured compound to be equal to or more than 95%.

The degree F of the bismuth layer structured compound is defined by the formula (1).

The dielectric characteristic of a dielectric layer can be markedly improved by orienting the bismuth layer structured compound in the [001] direction, namely, the c axis direction in this manner.

More specifically, in the case where a thin film capacitor is fabricated by forming, for example, an upper electrode on the dielectric layer of the multi-layered unit according to the present invention, even if the thickness of the dielectric layer is equal to or thinner than, for example, 100 nm, a thin film capacitor having a relatively high dielectric constant and low loss (tan δ) can be obtained. Further, a thin film capacitor having an excellent leak characteristic, an improved breakdown voltage, an excellent temperature coefficient of the dielectric constant and an excellent surface smoothness can be obtained.

In the present invention, it is particularly preferable that the bismuth layer structured compound contained in the dielectric layer has a composition represented by the stoichiometric compositional formula: $Ca_xSr_{(1-x)}Bi_4Ti_4O_{15}$, where x is equal to or larger than 0 and equal to or smaller than 1. If the bismuth layer structured compound having such a composition is used, a dielectric layer having a relatively large dielectric constant can be obtained and the temperature characteristic thereof can be further improved.

In the present invention, parts of the elements represented by the symbols A or B in the stoichiometric compositional formula of the bismuth layer structured compound contained in the dielectric layer are preferably replaced with at least one element Re (yttrium (Y) or a rare-earth element) selected from a group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

The preferable amount of replacement by the element Re depends upon the value of the symbol m. For example, in the case where the symbol m is equal to 3, in the compositional formula: $Bi_2A_{(2-x)}Re_xB_3O_{12}$, x is preferably equal to or larger than 0.4 and equal to or smaller than 1.8 and more preferably equal to or larger than 1.0 and equal to or smaller than 1.4. If the amount of replacement by the element Re is determined within this range, the Curie temperature (phase transition temperature from ferroelectric to paraelectric) of the dielectric layer can be controlled preferably to be equal to or higher than −100° C. and equal to or lower than 100° C. and more preferably to be equal to or higher than −50° C. and equal to or lower than 50° C. If the Curie point is equal to or higher than −100° C. and equal to or lower than 100° C., the dielectric constant of the dielectric thin film 6 increases. The Curie temperature can be measured by DSC (differential scanning calorimetry) or the like. If the Curie point becomes lower than room temperature (25° C.), tan δ further decreases and as a result, the loss value Q further increases.

Furthermore, in the case where the symbol m is equal to 4, in the compositional formula: $Bi_2A_{(3-x)}Re_xB_4O_{15}$, x is preferably equal to or larger than 0.01 and equal to or smaller than 2.0 and more preferably equal to or larger than 0.1 and equal to or smaller than 1.0.

Although the dielectric layer of the multi-layered unit according to the present invention has an excellent leak characteristic even if it does not contain the element Re, it is possible to further improve the leak characteristic by replacing part of the elements represented by the symbols A or B with the element Re.

For example, even in the case where no part of the elements represented by the symbols A or B in the stoichiometric compositional formula of the bismuth layer structured compound is replaced with element Re, the leak current measured at the electric filed strength of 50 kV/cm can be controlled preferably to be equal to or lower than $1 \times 10^{-7}$ A/cm$^2$ and more preferably to be equal to or lower than $5 \times 10^{-8}$ A/cm$^2$ and the short circuit ratio can be controlled preferably to be equal to or lower than 10% and more preferably to be equal to or lower than 5%. However, in the case where parts of the elements represented by the symbols A or B in the stoichiometric compositional formula of the bismuth layer structured compound are replaced with element Re, the leak current measured under the same condition can be controlled preferably to be equal to or lower than $5 \times 10^{-8}$ A/cm$^2$ and more preferably to be equal to or lower than $1 \times 10^{-8}$ A/cm$^2$ and the short circuit ratio can be controlled preferably to be equal to or lower than 5% and more preferably to be equal to or lower than 3%.

In the present invention, the dielectric layer can be formed using any of various thin film forming processes such as a vacuum deposition process, a sputtering process, a pulsed laser deposition process (PLD), a metal organic chemical vapor deposition process (MOCVD), a chemical solution deposition process (CSD process) such as a metal-organic decomposition process (MOD) and a sol-gel process or the like. Particularly, in the case where the dielectric layer has to be formed at a low temperature, a plasma CVD process, a photo-CVD process, a laser CVD process, a photo-CSD process, a laser CSD process or the like is preferably used for forming the dielectric layer.

The multi-layered unit according to the present invention can be used not only as a component of a thin film capacitor but also as a unit for causing an inorganic EL device to emit light. Specifically, an insulating layer is necessary between an electrode layer and an inorganic EL device in order to cause the inorganic EL device to emit light. Since a dielectric layer of a dielectric material containing a bismuth layer structured compound having an improved c axis orientation has a high insulating property, it is possible to cause an inorganic EL device to emit light in a desired manner by disposing the inorganic EL device on the dielectric layer, disposing another electrode on the inorganic EL device and applying a voltage between the electrode layer and the other electrode.

The above and other objects and features of the present invention will become apparent from the following description made with reference to the accompanying drawings.

DESCRIPTION OF THE PREFERRED EMBODIMENTS

Figure 1:
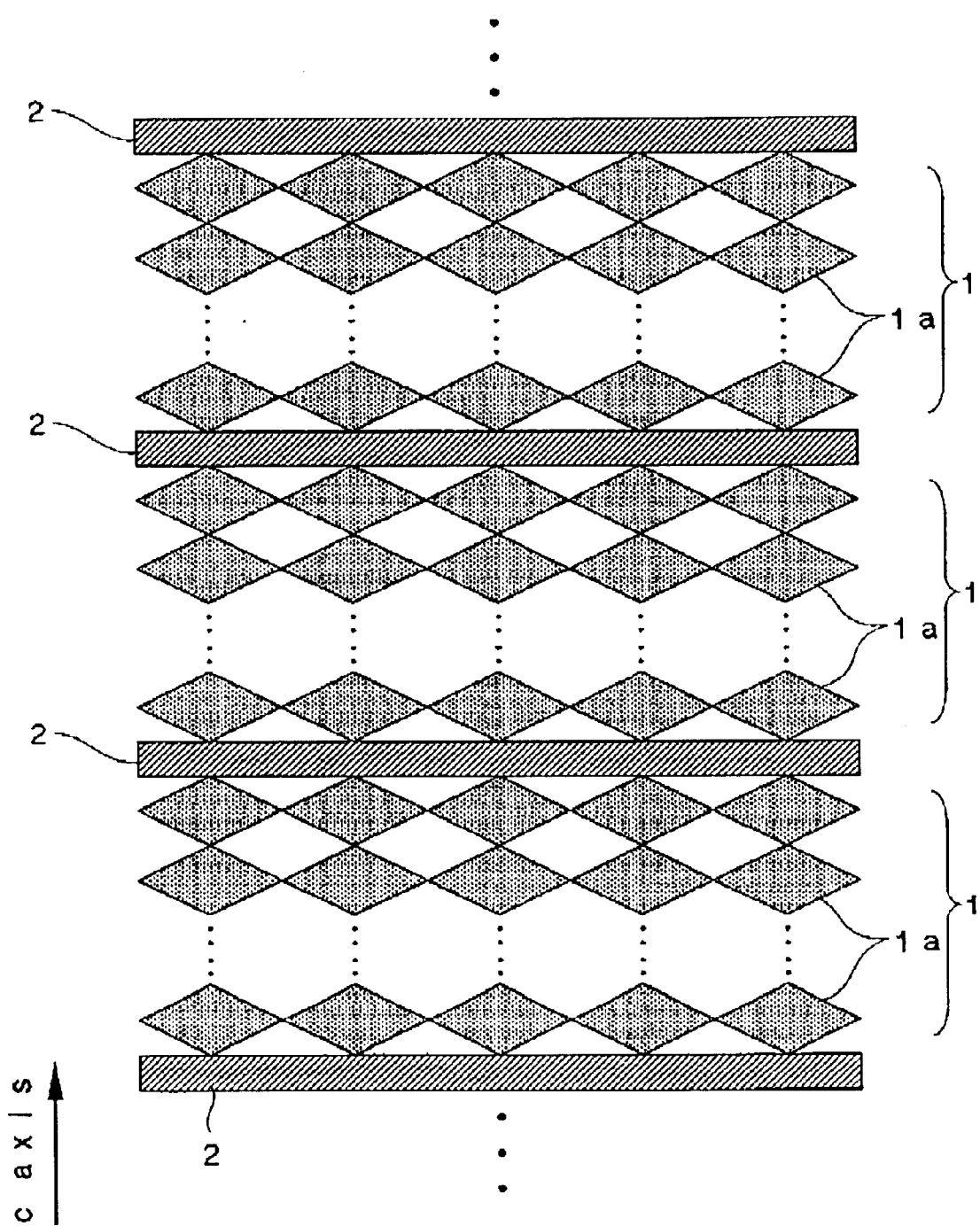
FIG. 1 is a drawing schematically showing the structure of a bismuth layer structured compound.
Figure 2:
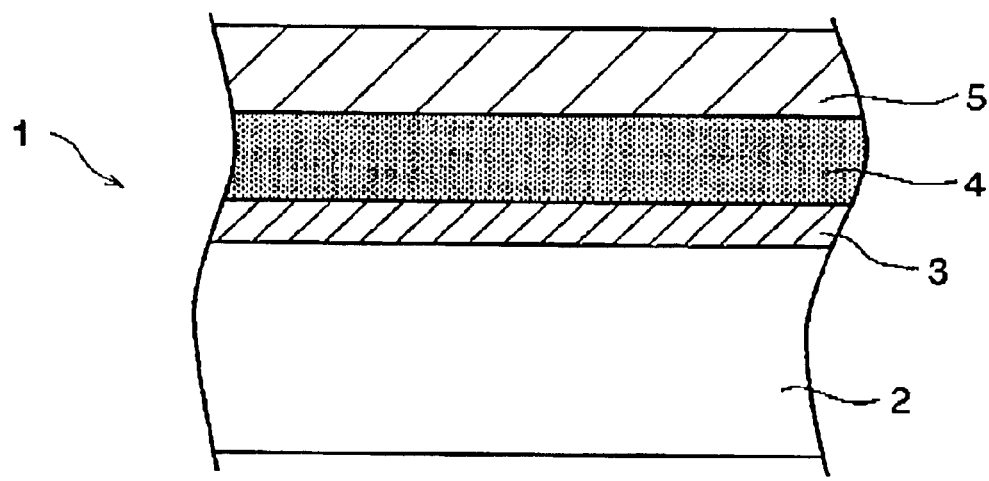
FIG. 2 is a schematic partial cross-sectional view showing a multi-layered unit which is a preferred embodiment of the present invention.

FIG. 2 is a schematic partial cross-sectional view showing a multi-layered unit which is a preferred embodiment of the present invention.

As shown in FIG. 2, a multi-layered unit 1 according to this embodiment is constituted by laminating a barrier layer 3, an electrode layer 4 and a dielectric layer 5 on a support substrate 2 in this order.

In this embodiment, the support substrate 2 of the multi-layered unit 1 is formed of a silicon single crystal.

The multi-layered unit 1 according to this embodiment includes a barrier layer 3 formed of silicon oxide on the support substrate 2.

The barrier layer 3 of silicon oxide is formed by, for example, thermal oxidation of silicon.

As shown in FIG. 2, an electrode layer 4 is formed on the barrier layer 3 and in this embodiment, the electrode layer 4 is formed of BSCCO (bismuth strontium calcium copper oxide) represented by the stoichiometric compositional formula: $Bi_2Sr_2CaCu_2O_8$ and is oriented in the [001] direction.

In the case of directly forming an electrode layer made of BSCCO (bismuth strontium calcium copper oxide) on the support substrate 2 made of silicon oxide, since constituents of BSCCO (bismuth strontium calcium copper oxide) diffuse into the silicon single crystal forming the support substrate 2 and it is impossible to form an electrode layer 4 oriented in the [001] direction, namely, the c axis direction. However, in this embodiment, since the electrode layer 4 is formed on the barrier layer 3 formed on the support substrate 2 made of the silicon single crystal, it is possible to effectively prevent constituents of BSCCO (bismuth strontium calcium copper oxide) from diffusing into the silicon single crystal forming the support substrate 2 and form an electrode layer 4 of BSCCO (bismuth strontium calcium copper oxide) oriented in the [001] direction, namely, the c axis direction in a desired manner.

Therefore, the barrier layer 3 is given thickness sufficient for preventing constituents of BSCCO (bismuth strontium calcium copper oxide) from diffusing into the silicon single crystal forming the support substrate 2, for example, equal to or thicker than 10 μm.

As shown in FIG. 2, the multi-layered unit 1 according to this embodiment includes an electrode layer 4 formed of BSCCO (bismuth strontium calcium copper oxide) represented by the stoichiometric compositional formula: $Bi_2Sr_2CaCu_2O_8$ and oriented in the [001] direction.

The BSCCO (bismuth strontium calcium copper oxide) represented by the stoichiometric compositional formula: $Bi_2Sr_2CaCu_2O_8$ has an anisotropic property and conductivity and enables epitaxial growth of a dielectric material containing a bismuth layer structured compound thereon.

Therefore, the electrode layer 4 can serve as an electrode and a buffer layer for ensuring that a dielectric layer 5 containing a bismuth layer structured compound oriented in the [001] direction, namely, the c axis direction, can be formed by epitaxially growing a dielectric material containing the bismuth layer structured compound thereon.

In the case of directly forming an electrode layer made of platinum or the like on the support substrate 2 made of silicon oxide or the like, since the electrode layer tends to be oriented in the [111] direction, it is difficult to epitaxially grow a dielectric layer of a dielectric material containing a bismuth layer structured compound on the electrode layer and orient the bismuth layer structured compound in the [001] direction, namely, the c axis direction. However, in this embodiment, since the electrode layer 4 is formed of BSCCO (bismuth strontium calcium copper oxide) represented by the stoichiometric compositional formula: $Bi_2Sr_2CaCu_2O_8$ and is formed of a material having an anisotropic property and conductivity and enabling epitaxial growth of a dielectric material containing a bismuth layer structured compound thereon, the electrode layer 4 can be oriented in the [001] direction. Therefore, it is possible to form a dielectric layer 5 by epitaxially growing a dielectric material containing a bismuth layer structured compound on the electrode layer 4 and reliably orient the bismuth layer structured compound contained in the dielectric layer in the [001] direction, namely, the c axis direction.

In this embodiment, an electrode layer 4 containing BSCCO (bismuth strontium calcium copper oxide) represented by the stoichiometric compositional formula: $Bi_2Sr_2CaCu_2O_8$ is formed, for example, using a pulsed laser deposition process (PLD).

When an electrode layer 4 containing BSCCO (bismuth strontium calcium copper oxide) represented by the stoichiometric compositional formula: $Bi_2Sr_2CaCu_2O_8$ is to be formed using a pulsed laser deposition process (PLD), BSCCO (bismuth strontium calcium copper oxide) represented by the stoichiometric compositional formula: $Bi_2Sr_2CaCu_2O_8$ is used as a target and the temperature of the barrier layer 3 of silicon oxide is maintained at 650° C., thereby forming an electrode layer 4 having a thickness of 100 nm and oriented in the [001] direction.

As shown in FIG. 2, the multi-layered unit 1 according to this embodiment includes a dielectric layer 5 formed on the electrode layer 4.

In this embodiment, the dielectric layer 5 is formed of a dielectric material containing a bismuth layer structured compound represented by the stoichiometric compositional formula: $SrBi_4Ti_4O_{15}$ wherein the symbol m is equal to 4 and the symbol $A_3$ is equal to $Bi_2+Sr$ in the general stoichiometric compositional formula of the bismuth layer structured compounds and having an excellent property as a capacitor material.

In this embodiment, the dielectric layer 5 is formed on the electrode layer 4 using a metal organic deposition (MOD) process.

Concretely, a toluene solution of 2-ethyl hexanoate Sr, a 2-ethyl hexanoate solution of 2-ethyl hexanoate Bi and a toluene solution of 2-ethyl hexanoate Ti are stoichiometrically mixed so that the mixture contains 1 mole of 2-ethyl hexanoate Sr, 4 moles of 2-ethyl hexanoate Bi and 4 moles of 2-ethyl hexanoate Ti and is diluted with toluene. The resultant constituent solution is coated on the electrode layer 4 using a spin coating method and after drying the resultant dielectric layer 5 is tentatively baked at a temperature under which the dielectric layer 5 cannot be crystallized.

The same constituent solution is coated on the thus tentatively baked dielectric layer 5 using a spin coating method to form a coating layer and the coating layer is dried and tentatively baked. These operations are repeated.

When tentative baking is completed, the dielectric layer 5 is baked and a series of operations including coating, drying, tentative baking, coating, drying, tentative baking and baking are repeated until a dielectric layer 5 having a required thickness, for example, 100 nm is obtained.

During these processes, a dielectric material containing a bismuth layer structured compound is epitaxially grown and a dielectric layer 5 oriented in the [001] direction, namely, the c axis direction is formed.

According to this embodiment, since the multi-layered unit 1 has such a structure that the barrier layer 3, the electrode layer 4 and the dielectric layer 5 are laminated on the support substrate 2 of a silicon single crystal, it is possible to easily incorporate a thin film capacitor into the support substrate of a silicon single crystal together with other devices such as a field effect transistor, a CPU and the like by, for example, providing an upper electrode on the dielectric layer 5, thereby fabricating an integrated device with a semiconductor.

Further, according to this embodiment, since the barrier layer 3 is formed of silicon oxide on the support substrate of a silicon single crystal, it is possible to prevent constituents of the electrode layer 4 from diffusing into the silicon single crystal forming the support substrate 2 and prevent the support substrate of a silicon single crystal from being affected by the electrode layer 4 to be formed thereon. Therefore, it is possible to form the electrode layer 4 of a material having an anisotropic property and conductivity and enabling epitaxial growth of a dielectric material containing a bismuth layer structured compound thereon to form an electrode layer 4 and to orient the electrode layer 4 in the [001] direction, namely, the c axis direction.

Furthermore, according to this embodiment, since the dielectric layer 5 of a dielectric material containing a bismuth layer structured compound is formed by epitaxially growing the dielectric material containing the bismuth layer structured compound on the electrode layer 4 oriented in the [001] direction, namely, the c axis direction, it is possible to reliably orient the dielectric layer 5 in the [001] direction and improve the c axis orientation thereof.

Therefore, according to this embodiment, since the multi-layered unit 1 includes a dielectric layer 5 formed of a dielectric material containing a bismuth layer structured compound oriented in the [001] direction, namely, the c axis direction, in the case of, for example, providing an upper electrode on the dielectric layer 5 of the multi-layered unit 1 according to this embodiment, thereby fabricating a thin film capacitor and applying a voltage between the electrode layer 4 and the upper electrode, the direction of an electric field substantially coincides with the c axis of the bismuth layer structured compound contained in the dielectric layer 5. As a result, since the ferroelectric property of the bismuth layer structured compound contained in the dielectric layer 5 can be suppressed and the paraelectric property thereof can be fully exhibited, it is possible to fabricate an integrated device with a semiconductor by incorporating a thin film capacitor having a small size and large capacity into the support substrate 2 of a silicon single crystal together with other devices such as a field effect transistor, a CPU and the like.

Further, according to this embodiment, since the multi-layered unit 1 includes the dielectric layer 5 formed of a dielectric material containing a bismuth layer structured compound oriented in the [001] direction, namely, the c axis direction and the dielectric layer 5 containing the bismuth layer structured compound whose c axis orientation is improved has a high insulating property, the dielectric layer 5 can be made thinner. As a result, it is possible to make a thin film capacitor much thinner and make an integrated device with a semiconductor into which a thin film capacitor is incorporated much smaller.

The present invention has thus been shown and described with reference to specific embodiments. However, it should be noted that the present invention is in no way limited to the details of the described arrangements but changes and modifications may be made without departing from the scope of the appended claims.

For example, in the above described embodiment, the multi-layered unit 1 is constituted by laminating on the support substrate 2, the barrier layer 3, the electrode layer 4 formed of BSCCO (bismuth strontium calcium copper oxide) represented by the stoichiometric compositional formula: $Bi_2Sr_2CaCu_2O_8$ and the dielectric layer 5 formed of a dielectric material containing a bismuth layer structured compound represented by the stoichiometric compositional formula: $SrBi_4Ti_4O_{15}$ and having an excellent property as a capacitor material in this order. However, the multi-layered unit 1 may be formed by further laminating on the dielectric layer 5 a plurality of unit multi-layered elements each including at least an electrode layer 4 and a dielectric layer 5, and a thin film capacitor may be fabricated by forming an upper electrode on the dielectric layer 5 of the uppermost unit multi-layered element. However, in the case where the multi-layered unit 1 is constituted by further laminating a plurality of unit multi-layered element on the dielectric layer 5, if an electrode layer included in each of the unit multi-layered elements is not formed by epitaxially growing crystals of a conductive material on a dielectric layer 5, even if a dielectric material containing a bismuth layer structured compound is epitaxially grown on the electrode layer, it is difficult to orient the bismuth layer structured compound in the [001] direction and form a dielectric layer of the dielectric material containing the bismuth layer structured compound oriented in the [001] direction. Therefore, it is required to form each unit multi-layered element so as to include an electrode layer, a buffer layer formed on the electrode layer and a dielectric layer formed of a dielectric material containing a bismuth layer structured compound on the buffer layer. It is further possible to laminate one or more unit multi-layered elements each including an electrode layer 4 and a dielectric layer 5 and one or more unit multi-layered elements each including an electrode layer, a buffer layer formed on the electrode layer and a dielectric layer formed on the buffer layer and formed of a dielectric material containing a bismuth layer structured compound on the dielectric layer 5 in an arbitrary order and form an upper electrode on the dielectric layer 5 of the uppermost unit multi-layered element, thereby fabricating a thin film capacitor.

Further, in the above described embodiment, although the support substrate 2 of the multi-layered unit 1 is formed of a silicon single crystal, it is not absolutely necessary to use a support substrate 2 formed of a silicon single crystal and the material for forming the support substrate 2 is not particularly limited insofar as it can be used for fabricating a semiconductor device into which various devices are incorporated. For, example, instead of a silicon single crystal, the support substrate 2 may be formed of a gallium arsenide crystal.

Furthermore, in the above described embodiment, although the barrier layer 3 is formed of silicon oxide on the support substrate 2, it is not absolutely necessary to form the barrier layer 3 of silicon oxide and the barrier layer 3 may be formed of any material insofar as it can prevent constituents of the electrode layer 4 to be formed thereon from diffusing into the support substrate 2 and the support substrate 2 from being affected by the electrode layer 4. For example, in the case where the support substrate 2 is formed of a gallium arsenide crystal, aluminum oxide ($Al_2O_3$) or magnesium oxide (MgO) is preferably selected for forming the barrier layer 3 from the viewpoint of stability.

Moreover, in the above described embodiment, the multi-layered unit 1 includes on the barrier layer 3, the electrode layer 4 formed of BSCCO (bismuth strontium calcium copper oxide) represented by the stoichiometric compositional formula: $Bi_2Sr_2CaCu_2O_8$ and serving as a buffer layer for epitaxially growing a dielectric material containing a bismuth layer structured compound thereon. However, it is not absolutely necessary to form the electrode layer 3 of BSCCO (bismuth strontium calcium copper oxide) represented by the stoichiometric compositional formula: $Bi_2Sr_2CaCu_2O_8$ and the material for forming the electrode layer 3 is not particularly limited insofar as it has an anisotropic property and conductivity and enables epitaxial growth of a dielectric material containing a bismuth layer structured compound thereon. As a material having an anisotropic property and conductivity and enabling epitaxial growth of a dielectric material containing a bismuth layer structured compound thereon, an oxide superconductor is preferably employed and a copper oxide superconductor having a $CuO_2$ plane is more preferably employed. Illustrative examples of copper oxide superconductors having a $CuO_2$ plane include BSCCO (bismuth strontium calcium copper oxide) represented by the stoichiometric compositional formula: $Bi_2Sr_2Ca_{n-1}Cu_nO_{2n+4}$ and YBCO (yttrium bismuth copper oxide) represented by the stoichiometric compositional formula: $YBa_2Cu_3O_7\text{-}\delta$.

Further, in the above described embodiment, although the electrode layer 4 of the multi-layered unit 1 is formed using a pulsed laser deposition process (PLD), it is not absolutely necessary to form the electrode layer 4 using a pulsed laser deposition process (PLD) and the electrode layer 4 may be formed using any of various thin film forming processes such as a vacuum deposition process, a sputtering process, a metal organic chemical vapor deposition process (MOCVD), a chemical solution deposition process (CSD process) such as a metal-organic decomposition process (MOD) and a sol-gel process or the like.

Furthermore, in the above described embodiment, the multi-layered unit 1 includes on the electrode layer 4 the dielectric layer 5 formed of a dielectric material containing a bismuth layer structured compound represented by the stoichiometric compositional formula: $SrBi_4Ti_4O_{15}$ wherein the symbol m is equal to 4 and the symbol $A_3$ is equal to $Bi_2$+Sr in the general stoichiometric compositional formula of the bismuth layer structured compounds. However, it is not absolutely necessary to form on the electrode layer 4 the dielectric layer 5 formed of a dielectric material containing a bismuth layer structured compound represented by the stoichiometric compositional formula: $SrBi_4Ti_4O_{15}$ wherein the symbol m is equal to 4 and the symbol $A_3$ is equal to $Bi_2+Sr$ in the general stoichiometric compositional formula of the bismuth layer structured compounds and the dielectric layer 5 may be formed of a dielectric material containing a bismuth layer structured compound wherein m is not equal to 4 in the general stoichiometric compositional formula of a bismuth layer structured compound. Further, the dielectric layer 5 may be formed of a dielectric material containing another bismuth layer structured compound having different constituent elements. Moreover, in the above described embodiment, although the dielectric layer 5 is formed using a metal-organic decomposition process (MOD), it is not absolutely necessary to form the dielectric layer 5 using a metal-organic decomposition process and the dielectric layer 5 may be formed using some other thin film forming processes such as a vacuum deposition process, a sputtering process, a pulsed laser deposition process (PLD), a metal organic chemical vapor deposition process (MOCVD), other chemical solution deposition process (CSD process) such as a sol-gel process or the like.

Moreover, in the above described embodiment, although the multi-layered unit 1 is used as a component of a thin film capacitor, the multi-layered unit 1 can be used not only as a component of a thin film capacitor but also as a multi-layered unit for causing an inorganic EL device to emit light. Specifically, although an insulating layer having a high insulating property is necessary between an electrode layer 4 and an inorganic EL device in order to cause the inorganic EL device to emit light, since a dielectric layer 5 of a dielectric material containing a bismuth layer structured compound having an improved c axis orientation has a high insulating property, it is possible to cause an inorganic EL device to emit light in a desired manner by disposing the inorganic EL device on the dielectric layer 5, disposing another electrode on the inorganic EL device and applying a voltage to the inorganic El device.

According to the present invention, it is possible to provide a multi-layered unit including an electrode and a dielectric layer which can constitute a compact thin film capacitor which is suitable for incorporation into a semiconductor wafer together with other devices such as a field effect transistor (FET), a CPU (central processing unit) and the like and has a large capacity and an excellent dielectric characteristic.

What is claimed is:

1. A multi-layered unit constituted by forming on a semiconductor wafer, a barrier layer, an electrode layer, which is formed of a material having an anisotropic property and conductivity and enabling epitaxial growth of a dielectric material containing a bismuth layer structured compound thereon and is oriented in a [001] direction, and a dielectric layer formed by epitaxially growing a dielectric material containing a bismuth layer structured compound on the electrode layer and formed of the dielectric material containing the bismuth layer structured compound oriented in the [001] direction in this order.

2. A multi-layered unit in accordance with claim 1, wherein the support substrate is formed of a silicon single crystal and the barrier layer is formed of silicon oxide.

3. A multilayered unit in accordance with claim 1, wherein the electrode layer is formed of an oxide superconductor.

4. A multi-layered unit in accordance with claim 2, wherein the electrode layer is formed of an oxide superconductor.

5. A multi-layered unit in accordance with claim 3, wherein the electrode layer is formed of a copper oxide superconductor having a $CuO_2$ plane.

6. A multi-layered unit in accordance with claim 4, wherein the electrode layer is formed of a copper oxide superconductor having a $CuO_2$ plane.

7. A multi-layered unit in accordance with claim 5, wherein the electrode layer is formed of a copper oxide superconductor having a $CuO_2$ plane selected from a group consisting of BSCCO (bismuth strontium calcium copper oxide) represented by the stoichiometric compositional formula: $Bi_2Sr_2Ca_{n-1}Cu_nO_{2n+4}$ and YBCO (yttrium bismuth copper oxide) represented by the stoichiometric compositional formula: $YBa_2Cu_3O_7-\delta$.

8. A multi-layered unit in accordance with claim 6, wherein the electrode layer is formed of a copper oxide superconductor having a $CuO_2$ plane selected from a group consisting of BSCCO (bismuth strontium calcium copper oxide) represented by the stoichiometric compositional formula: $Bi_2Sr_2Ca_{n-1}Cu_nO_{2n+4}$ and YBCO (yttrium bismuth copper oxide) represented by the stoichiometric compositional formula: $YBa_2Cu_3O_7-\delta$.

9. A multi-layered unit in accordance with claim 1, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

10. A multi-layered unit in accordance with claim 2, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+1}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

11. A multi-layered unit in accordance with claim 3, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

12. A multi-layered unit in accordance with claim 4, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

13. A multi-layered unit in accordance with claim 5, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

14. A multi-layered unit in accordance with claim 6, wherein the dielectric layer contains a bismuth layer structured compound having a composition represented by a stoichiometric compositional formula. $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

15. A multi-layered unit in accordance with claim 7, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a us group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

16. A multi-layered unit in accordance with claim 8, wherein the dielectric layer contains a bismuth layer structured compound having a composition represented by a stoichiometric compositional formula: $(Bi_2O_2)^{2+}(A_{m-1}B_mO_{3m+1})^{2-}$ or $Bi_2A_{m-1}B_mO_{3m+3}$, where the symbol m is a natural number, the symbol A is at least one element selected from a group consisting of sodium (Na), potassium (K), lead (Pb), barium (Ba), strontium (Sr), calcium (Ca) and bismuth (Bi), and the symbol B is at least one element selected from a group consisting of iron (Fe), cobalt (Co), chromium (Cr), gallium (Ga), titanium (Ti), niobium (Nb), tantalum (Ta), antimony (Sb), vanadium (V), molybdenum (Mo) and tungsten (W) and when the symbol A and/or B includes two or more elements, the ratio of the elements is arbitrarily determined.

17. A multi-layered unit in accordance with claim 9, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

18. A multi-layered unit in accordance with claim 10, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

19. A multi-layered unit in accordance with claim 11, wherein the dielectric layer is formed using a thin firm forming process selected from a group consisting of a vacuum deposition process, a sputtering process, a pulsed laser deposition process, a metal organic chemical vapor deposition process and a chemical solution deposition process including a metal-organic decomposition process.

20. A multi-layered unit in accordance with claim 12, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

21. A multi-layered unit in accordance with claim 13, wherein the dielectric layer is formed using a thin firm forming process selected from a group consisting of a vacuum deposition process, a sputtering process, a pulsed laser deposition process, a metal organic chemical vapor deposition process and a chemical solution deposition process including a metal-organic decomposition process.

22. A multi-layered unit in accordance with claim 14, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

23. A multi-layered unit in accordance with claim 15, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

24. A multi-layered unit in accordance with claim 16, wherein the dielectric layer is formed using a thin film forming process selected from a group consisting of a vacuum deposition process, a sputtering process, a pulsed laser deposition process, a metal organic chemical vapor deposition process and a chemical solution deposition process including a metal-organic decomposition process.

* * * * *

UNITED STATES PATENT AND TRADEMARK OFFICE
CERTIFICATE OF CORRECTION

PATENT NO. : 6,885,540 B2
DATED : April 26, 2005
INVENTOR(S) : Yukio Sakashita

It is certified that error appears in the above-identified patent and that said Letters Patent is hereby corrected as shown below:

<u>Column 15,</u>
Line 52, "us" should be omitted.

<u>Column 16,</u>
Lines 25 and 38, "firm" should read as -- film --.

Signed and Sealed this

Eleventh Day of October, 2005

JON W. DUDAS
*Director of the United States Patent and Trademark Office*